United States Patent [19]

Okamoto et al.

[11] Patent Number: 5,370,076
[45] Date of Patent: Dec. 6, 1994

[54] METHOD OF PRODUCING SINGLE CRYSTAL OF KTIOPO4

[75] Inventors: Tsutomu Okamoto; Koji Watanabe; Tatsuo Fukui; Yasushi Minoya; Koichi Tatsuki; Shigeo Kubota, all of Kanagawa, Japan

[73] Assignee: Sony Corporation, Tokyo, Japan

[21] Appl. No.: 56,530

[22] Filed: May 5, 1993

[30] Foreign Application Priority Data

May 15, 1992 [JP] Japan ................... 4-123955
Dec. 29, 1992 [JP] Japan ................... 4-360084

[51] Int. Cl.$^5$ ........................... C30B 9/12
[52] U.S. Cl. ........................... 117/36; 117/13; 117/937; 423/306; 423/593; 423/616
[58] Field of Search .......... 156/617.1, 621, 623 R, 156/624, DIG. 70, DIG. 71; 423/306, 593, 616

[56] References Cited

U.S. PATENT DOCUMENTS

| | | | |
|---|---|---|---|
| 4,305,778 | 12/1981 | Gier | 156/623 R |
| 4,724,038 | 2/1988 | Pastor et al. | 156/620.2 |
| 4,746,396 | 5/1988 | Marnier | 156/623 R |
| 4,761,202 | 8/1988 | Bordui et al. | 156/621 |
| 4,961,819 | 10/1990 | Marnier | 156/623 R |
| 5,066,356 | 11/1991 | Ferretti et al. | 156/623 R |
| 5,084,206 | 1/1992 | Ballman et al. | 252/301.4 |
| 5,264,073 | 11/1993 | Cheng | 156/623 R |

OTHER PUBLICATIONS

"X-ray topography study of flux grown KTP crystals"; Halfpenny, et al; Journal of Crystal Growth (113) 1991 pp. 722–725.
"Solubility and Crystal Growth of KiTuOPO4 In Polyphosphate Solvents", Loiacono et al; Journal of Crystal Growth 104 (1990) pp. 389–391.

Primary Examiner—R. Bruce Breneman
Assistant Examiner—Felisa Garret
Attorney, Agent, or Firm—Hill, Steadman & Simpson

[57] ABSTRACT

A method of growing a single crystal of $KTiOPO_4$ which is a nonlinear optical material is disclosed. Growth of the single crystal of $KTiOPO_4$ is carried out by melting a $KTiOPO_4$ material with a flux to produce a melt, then contacting a seed crystal to the melt, and by slowly cooling at a saturation temperature or below. At this time, molar fractions of $K_2O$, $P_2O_5$ and $TiO_2$ contained in the melt fall within a region surrounded by six point in a $K_2O$-$P_2O_5$-$TiO_2$ ternary phase diagram of A ($K_2O$:0.4150, $P_2O_5$:0.3906, $TiO_2$: 0.1944), B ($K_2O$:0.3750, $P_2O_5$: 0.3565, $TiO_2$: 0.2685), C ($K_2O$: 0.3750, $P_2O_5$: 0.3438, $TiO_2$: 0.2813), D ($K_2O$: 0.3850, $P_2O_5$: 0.3260, $TiO_2$: 0.2890), E ($K_2O$: 0.4000, $P_2O_5$: 0.3344, $TiO_2$: 0.2656), and F ($K_2O$: 0.4158, $P_2O_5$: 0.3744, $TiO_2$: 0.2098). In addition, $K_{15}P_{13}O_{40}$ or the same composition produced by melting is used as the flux, and the proportion of a $KTiOPO_4$ element in a composition of the melt is prescribed to 83.5 to 90.0 mol %. The seed crystal is set so that a C axis is in a direction perpendicular to a melt surface. Then, the seed crystal contacted to the melt is rotated and slowly cooled. Thus, a single crystal of $KTiOPO_4$ of single domain at the end of growth can be produced.

8 Claims, 4 Drawing Sheets

METHOD OF PRODUCING SINGLE CRYSTAL OF KTIOPO$_4$

FIELD OF THE INVENTION

This invention relates to a method of producing a single crystal of KTiOPO$_4$ employed as, for example, a nonlinear optical device.

BACKGROUND OF THE INVENTION

Because of recent emergence of a laser having an intense output and good coherence, it has become possible to obtain a light having a wavelength of ½ as the second harmonic generation, hereinafter referred to as SHG, by using nonlinear optical devices.

The nonlinear optical devices are required to be crystals of relatively large optical classes of not less than 1 mm. For instance, a single crystal of KTiOPO$_4$ which is a nonlinear optical crystal is known as a typical example of the nonlinear optical devices. The single crystal of KTiOPO$_4$ is produced by hydrothermal methods or flux methods to be described later.

As the flux methods among these methods of producing single crystals of KTiOPO$_4$, a method of melting and synthesizing, for example, a TiO$_2$ solution into K$_2$P$_2$O$_7$ and K$_3$PO$_4$, (see L. Ouvard, Comptes Rendus 111, p. 177–179 (1890)), and a method of producing powders of KTiOPO$_4$ by heating a predetermined ratio of KPO$_3$/TiO$_2$(=1 to 4) at temperatures of 900° C. to 1200° C. and then cooling at a rate of 80° C. per hour, (see R. Masse et al., Bull. Soc. Mineral Crystallogr. 94, p.437–439 (1971)) have been known for long.

As a recent example, the following method is disclosed in the U.S. Pat No. 4,231,838. In this disclosure, KTiOXO$_4$ and a flux K/X/O (wherein X is P or As) or precursors of these are used as ingredients. The ratio of the starting materials lies within the region of the ternary phase diagram K$_2$O/X$_2$O$_5$/(TiO$_2$)$_2$ where the object product KTiOXO$_4$ of Pna2$_1$ type is the only stable solid phase in equilibrium with the molten flux. With the above-mentioned materials, a single crystal of KTiOXO$_4$ large enough to be used as a nonlinear optical material is produced by the temperature gradient process, or the uniform heating process.

In addition, results of measurement of solubility curves of the single crystal of KTiOPO$_4$ produced when K$_4$P$_2$O$_7$, K$_8$P$_6$O$_{19}$ and K$_{15}$P$_{13}$O$_{40}$ are used as fluxes, and comparison with a case of using a flux K$_6$P$_4$O$_{13}$ in the technique described in the above-mentioned U.S. Pat. No. 4,231,838 are reported in G.M. Loiacono et al., J Crystal Growth 104, p. 389–391 (1990)).

Thus, while tile re have been various kinds of literature on methods of producing a single crystal of KTiOPO$_4$, none of the proposed methods can produce a crystal of single domain.

On the contrary, in crystal growth of KTiOPO$_4$ attempted by the present inventors by using the above-mentioned K$_6$P$_4$O$_{13}$, it was confirmed that the resultant crystals exhibited polarization of multi-domain.

The presence of multi-domain becomes a cause of a reduction in SHG output and deterioration of efficiency of the nonlinear optical materials as SHG, (see J.D. Bierlein et al., Appl. Phis. Lett. 51, p. 1322 (1987)).

In order to solve this problem, a method of producing single domain by cutting out a crystal ingot. having multi-domain in a bulk shape or i n a substrate shape, and then implementing heat processing and applying electric fields during the heat processing i s employed.

For example, according to G.M. Loiacono et al. who examined the presence of multi-domain, single domain is produced by cutting out a plate from a grown single crystal of multi-domain in a vertical direction toward a C axis (polarization axis), forming an electrode on both sides of the plate (C plate), and applying predetermined voltage in a state of being heated to approximately 500° C.

However, these conventional methods have the following problems: that it is difficult to produce single domain, depending on the arrangement of multi-domain (e.g., an arrangement of zigzag polarization proceeding); that the poling process including formation of electrodes is rough; and that defects generated on boundaries of the domain tend to remain even after the poling. Accordingly, it is difficult to attain sufficient production of single domain.

Thus, it is the object of the present invention to provide a method of producing a single crystal of KTiOPO$_4$ whereby sufficient production of single domain and crystal growth of high quality can be achieved.

SUMMARY OF THE INVENTION

According to the present invention, starting materials are dissolved into a flux to produce a melt in a state of super saturation, and then, crystal growth is carried out by immersing a seed crystal in the melt. Thus, single domain is produced in a state at the end of the growth without any additional processing, thereby producing a single crystal of KTiOPO$_4$.

That is, a first aspect of the present invention comprises a crystal which is of single domain in a state at the end of the growth.

A second aspect of the present invention comprises melting KTiOPO$_4$ materials together with a flux to produce a melt, contacting a seed crystal with the melt, and setting molar fractions of K$_2$O, P$_2$O$_5$ and TiO$_2$ contained in the melt within a region surrounded by six points of A (K$_2$O: 0.4150, P$_2$O$_5$: 0.3906, TiO$_2$: 0.1944), B (K$_2$O: 0.3750, P$_2$O$_5$: 0.3565, TiO$_2$: 0.2685), C (K$_2$O: 0.3750, P$_2$O$_5$: 0.3438, TiO$_2$: 0.2813), D (K$_2$O: 0.3850, P$_2$O$_5$: 0.3260, TiO$_2$: 0.2890), E (K$_2$O: 0.4000, P$_2$O$_5$: 0.3344, TiO$_2$: 0.2656), and F (K$_2$O: 0.4158, P$_2$O$_5$: 0.3744, TiO$_2$: 0.2098) in the ternary phase diagram of K$_2$O-P$_2$O$_5$-TiO$_2$, in growing a single crystal of KTiOPO$_4$ while slowly cooling at a saturation temperature or below.

A third aspect of the present invention comprises using, as the flux, K$_{15}$P$_{13}$O$_{40}$ or the same composition produced by melting, and setting the proportion of KTiOPO$_4$ components in the melt composition to 83.5 to 90.0 mol %.

According to the present invention, selection of kinds of the melt composition and the flux alone renders it possible to achieve production of single domain without processing such as poling, and to produce a single crystal of KTiOPO$_4$ exhibiting high SHG efficiency as a nonlinear optical material and high quality. Therefore, with the present invention, no additional equipment is necessary, such as a heat processing apparatus and an electric source for applying electric fields, and processing such as poling is omitted. Thus, time otherwise spent on substrate processing, electric field application and heat processing can be saved, thereby improving production efficiency. Further, with the present invention, generation of damage to the crystal in these processes can be prevented.

DETAILED DESCRIPTION OF PREFERRED EMBODIMENTS

Figure 1:
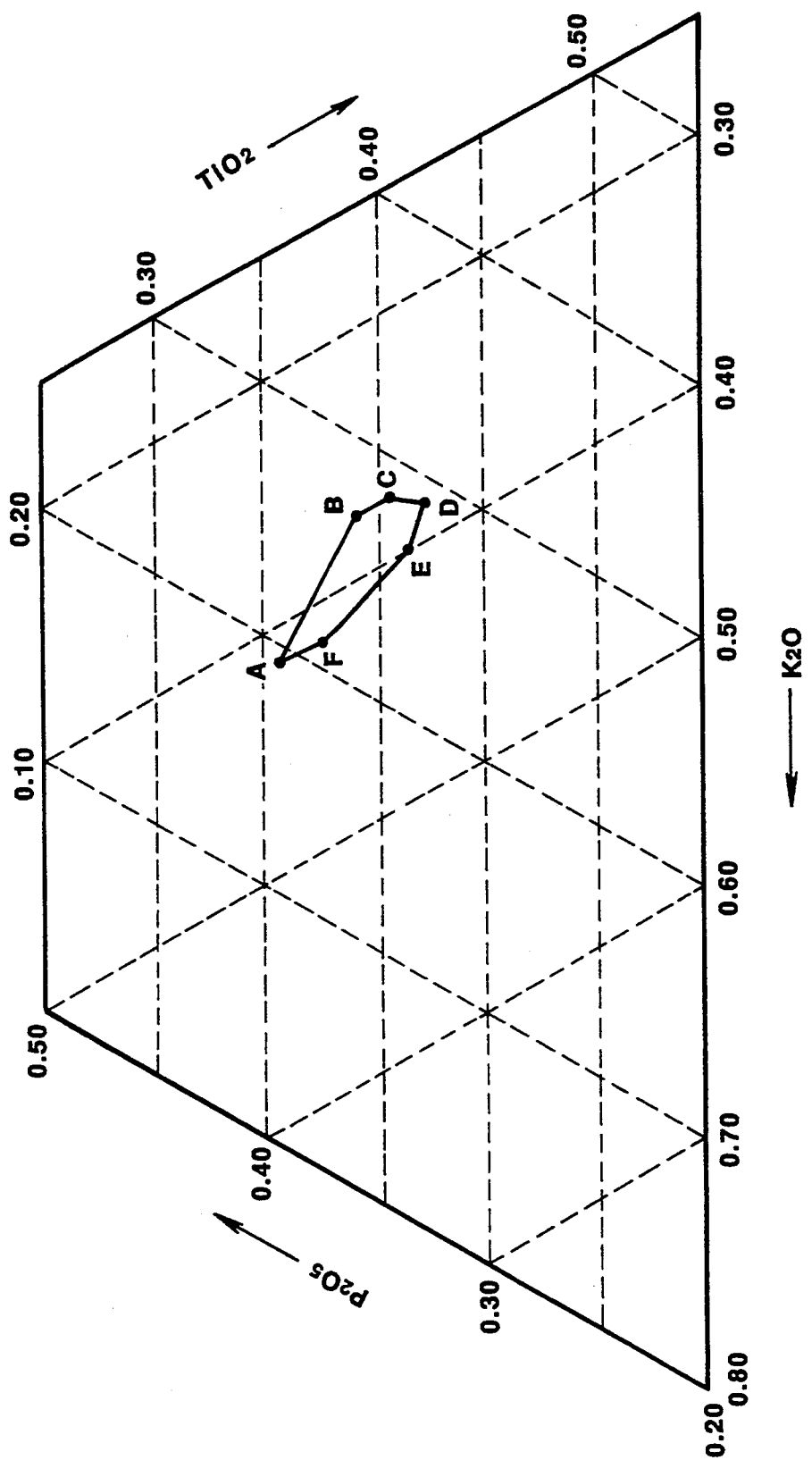
FIG. 1 is a ternary phase diagram of $K_2O$-$P_2O_5$-$TiO_2$.

The present invention is a method of producing a single crystal of $KTiOPO_4$ utilizing so-called Top Seeded Solution Growth (TSSG) method.

The TSSG method is a type of the so-called flux method in which a seed crystal is grown by melting starting materials into a flux to generate a melt in a state of super saturation, and then immersing the seed crystal into the melt.

According to the TSSG method, an increase in size of the single crystal of $KTiOPO_4$ to be produced is expected, and control of growth orientation of the crystal to be grown can be realized by prescribing the orientation of the seed crystal.

With the present invention, in producing a single crystal of $KTiOPO_4$ by the TSSG method, molar fractions of $K_2O$, $P_2O_5$ and $TiO_2$ contained in the melt fall within a region surrounded by six points of A ($K_2O$: 0.4150, $P_2O_5$: 0.3906, $TiO_2$: 0. 1944), B ($K_2O$: 0.3750, $P_2O_5$: 0.3565, $TiO_2$: 0.2685), C ($K_2O$: 0.3750, $P_2O_5$ 0.3438, $TiO_2$: 0.2813), D ($K_2O$: 0.3850, $P_2O_5$: 0.3260, $TiO_2$: 0.2890), E ($K_2O$: 0.4000, $P_2O_5$: 0.3344, $TiO_2$: 0.2656), F ($K_2O$: 0.4158, $P_2O_5$: 0.3744, $TiO_2$: 0.2098) in the $K_2O$-$P_2O_5$-$TiO_2$ ternary phase diagram.

By setting these conditions, the grown single crystal of $KTiOPO_4$ becomes a crystal of single domain in a state at the end of growth, or in an as-grown state, without carrying out any processing.

Deviation of the molar fractions of $K_2O$, $P_2O_5$ and $TiO_2$ contained in the melt from the above-mentioned region causes inconvenience, such as, generation of a crystal of $KTi_2(PO_4)_3$ of a different phase instead of the crystal of $KTiOPO_4$, and generation of multi-domain of the crystal of $KTiOPO_4$. Also, if the proportion of the $KTiOPO_4$ component in the melt is larger than a region indicated by line B-C-D in the ternary phase diagram, there is a fear that a rise in the saturation temperature of the melt may cause coloring to the crystal, and that necessity of a high growth temperature may cause intense vaporization of the flux and a change in its composition, even though it is possible to produce a single crystal of $KTiOPO_4$ of single domain. Therefore, the line B-C-D indicates the upper limit of $KTiOPO_4$ content volume in the; melt.

Further, it is preferable to use, as the flux, $K_{15}P_{13}O_{40}$ or the same composition produced by melting, and at the same time, to set the proportion of the $KTiOPO_4$ component in the melt composition to 83.5 to 90.0 mol %. This is because by setting the molar fractions of $K_2O$, $P_2O_5$ and $TiO_2$ to line C-F in the $K_2O$-$P_2O_5$-$TiO_2$ ternary phase diagram, it becomes possible to take the largest composition range in the polygonal area indicated by the above-mentioned A to F, and al so to g row a crystal of stable quality without precipitating heterogeneity in phase.

As the seed crystal , it is preferable to use a crystal of $KTiOPO_4$, and to arrange the C axis in a direction perpendicular to the melt surface; at least at a portion where the seed crystal contacts the melt. By thus prescribing the orientation of the seed crystal, it becomes possible to sufficiently control growth orientation of the crystal %o be grown.

The crystal axes of the seed crystal are set so that $a = 12.82 Å$, $b = 6.40 Å$, and $c = 10.58 Å$.

Further, in this grow%h, slow cooling at the saturation temperature or be low is necessary for maintaining a suitable super saturation degree.

In the slow cooling, it is preferable to rotate the seed crystal . By rotating the seed crystal , it becomes possible to attain uniformity of the melt composition, thereby carrying out crystal growth in good conditions. In this case, a suitable rotary speed of the seed crystal falls within a range between 30 to 300 rpm. If the rotary speed is lower than 30 rpm, sufficient agitation effects cannot be obtained, and spontaneous nucleation in the melt due to partial imbalance of melt tends to be generated. On the other hand, if the rotary speed is higher than 300 rpm, the melt surface is disordered, and thus waves are caused on the crystal surface, thereby generating coarseness or a cavity which cannot be grown in the crystal and deteriorating the quality of the crystal.

As a method of thus rotating the seed crystal , a so-called reverse turn, whereby the direction of rotation is altered at predetermined intervals for preventing eccentricity of the crystal , is preferable.

If the cooling speed is too low, it takes long to carry out the growth and thus is not practical. If the cooling speed is too high, spontaneous nucleatin due to super saturation is generated in the melt besides the original seed crystal portion, and adherence of spontaneous nucleation to the growing crystal and generation of the cavity due to rapid growth of the spontaneous nucleation may cause deterioration of the quality of the crystal. Accordingly, in order to avoid these problems, the cooling temperature is preferably set to $0.01° \sim 5°$ C. per hour, and more preferably to $0.1° \sim 1°$ C. per hour.

Although the present invention is explained by specific examples hereinbelow, the present invention is not limited to these examples.

First, a single crystal growth apparatus used in the present embodiment is explained.

Figure 2:
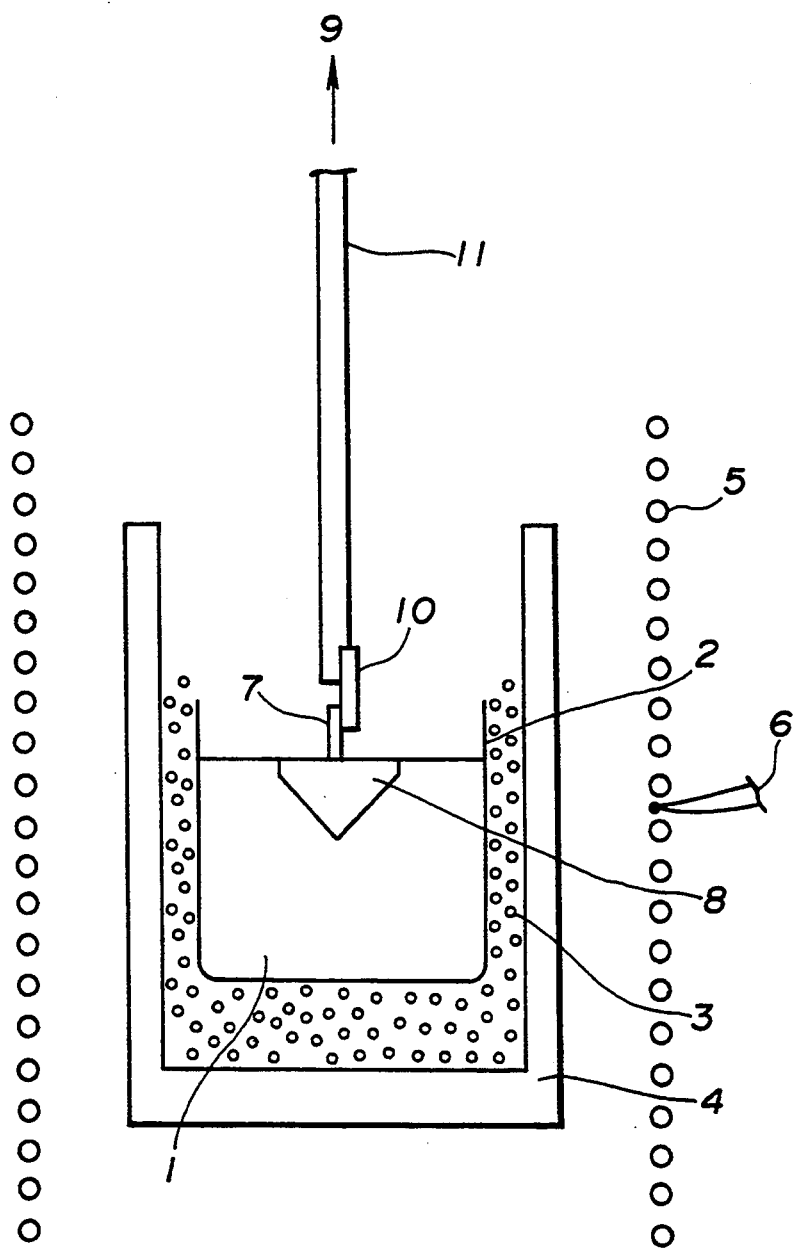
FIG. 2 is a schematic cross-sectional view showing an arrangement of a single crystal growth apparatus used in growing a single crystal of $KTiOPO_4$ to which the present invention is applied.

With the single crystal growth apparatus, as shown in FIG. 2, there are provided, in a growth furnace held at a predetermined temperature, a patinum crucible 2 accommodating a melt 1 comprised of $KTiOPO_4$ as a starting material melted into a flux, alumina balls 3 and an alumina furnace material 4 for holding the platinum crucible 2, a kanthal wi re resistance heater 5 for heating the melt 1 , and a temperature; detection thermocouple 6 for controlling the temperature in the growth furnace.

On the upper portion of the growth furnace, a rotating/ lifting unit 9 is arranged for rotating a seed crystal 7 and lifting a single crystal 8 of $KTiOPO_4$ which has been grown, from the melt 1.

At the tip of the rotating/lifting unit 9, the seed crystal 7 is mounted via a platinum square bar 10 and a sapphire bar 11.

EXAMPLE 1

Crystal growth of a single crystal of $KTiOPO_4$ is carried out in the following manner, by using the above-mentioned single crystal growth apparatus.

First, reagents to be mentioned below were used as starting materials, and each of the reagents was weighed so that, when a $KTiOPO_4$ component synthesized by the reagents was dissolved into a flux of $K_{15}P_{13}O_{40}$ (mol % of $P_2O_5$, 46.43%; $K_2O$, 53.57%), the proportion of the $KTiOPO_4$ component in the melt composition was 83.66 mol % (the proportion of the flux of $K_{15}P_{13}O_{40}$, 16.34 mol %). That is, a composition indicated by a point on a line of $K_2O$-$P_2O_5$ in a ternary phase diagram of $K_2O$-$P_2O_5$-$TiO_2$ as shown in FIG. I at which the molar ratio of $P_2O_5$ ($P_2O_5/(P_2O_5+K_2O)$) is 46.43 mol % and by a point on a straight line connecting points of $KTiOPO_4$ ($K_2O$: $P_2O_5$: $TiO_2$ =0.25: 0.25: 0.50) at which $K_2O$ is 0.415 mol, or a composition indicated by a pointed denoted by $J_1$ in FIG. 3 at which molar fractions of $K_2O$, $P_2O_5$, $TiO_2$ are 0.415, 0.3737, 0.2113, was intended.

Meanwhile, the melt composition was converted into the molar ratio of the flux of $K_{15}P_{13}O_{40}$ and the $KTiOPO_4$ component. In this example, the following reagents were selected as the starting materials. However, any reagent having the same composition after the reaction can be used other than the reagents selected in this example. For instance, the use of reagents such as $K_2CO_3$, $KNO_3$ and $NH_4H_2PO_4$ makes it possible to carry out similar crystal growth.

The reagents used in this example:

| | |
|---|---|
| $KH_2PO_4$ | 456.54 g |
| $K_2HPO_4$ | 72.49 g |
| $TiO_2$ | 85.15 g |

Next, the reagents, after mixed, were put into a platinum crucible 70 mm in diameter, and were presintered at 800° C.

Then, a melt was produced by heating the presintered mixture at a high temperature and completely dissolving it. The height of the melt was about 60 mm.

At this time, temperature distribution in a direction of melt inside depth fin the central portion of the platinum crucible in a stationary skate was measured. The result is that the temperature at a portion 50 mm deep from the melt surface was about 5° C. higher than that of the melt surface, and that the temperature between the portion and the melt surface was varied gradually.

Next, a crystal of $KTiOPO_4$ was experimentally immersed into the melt, and saturation temperature Ts of the melt having the above-mentioned composition was measured.

In measuring the saturation temperature Ts, the crystal of $KTiOPO_4$ was immersed into the melt while the melt was kept at a constant temperature, and then was for 30 minutes at a rotary speed of 200 rpm. Thus, the state of growth of the $KTiOPO_4$ crystal was observed. The same operation was repeated with the temperature of the melt varied, and the temperature of the melt surface at the time when neither melting nor crystal growth of the $KTiOPO_4$ crystal was observed was measured, thereby determining the temperature as the saturation temperature Ts.

As a result, the saturation temperature of the melt of the above-mentioned composition was found to be 994° C.

Then, a single crystal of $KTiOPO_4$ was actually produced under growth conditions to be mentioned below. In the present example, a crystal of $KTiOPO_4$ having a square cross-sectional shape (a axis x b axis: 2 mm×2 ram) and having a substantially vertical C axis 10~15 mm in length (in the direction of C axis) was used as the seed crystal 7.

Growth conditions of the crystal:

| | |
|---|---|
| seed crystal orientation | <001> |
| rotary speed of seed crystal (with reverse turn at intervals of 10 min.) | 200 rpm |
| lifting speed of seed crystal | 0 mm/hour |
| cooling temperature | 0.25° C./hour |
| cooling temperature range | 990–951° C. |

After the end of growth, a resultant single crystal of $KTiOPO_4$ was lifted from the melt 1 by the rotating-/lifting unit 9, The crystal was held so that, the lower edge of the crystal was in a position at a height of about 5 mm from the melt surface, and after cool ed to the room temperature at a rate of 50° C./hour, the crystal was taken out from the single crystal growth apparatus. Thus, the single crystal 8 of $KTiOPO_4$ having a weight of 8.2 g was produced.

Figure 4:
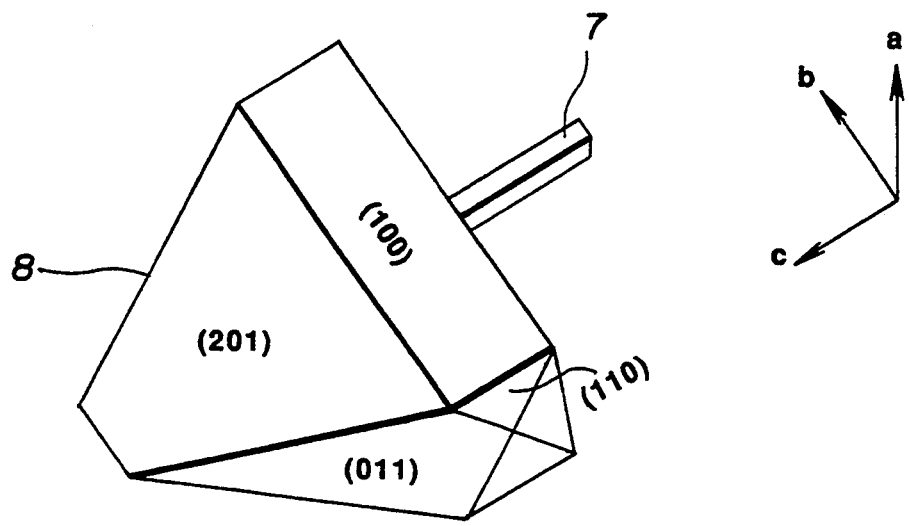
FIG. 4 is a schematic view showing a natural face which has emerged on the single crystal of $KTiOPO_4$ of the present invention.
Figure 5:
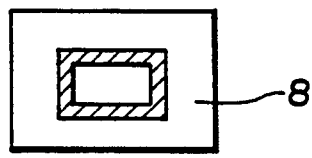
FIG. 5 is a schematic plan view showing polarization of the single crystal of $KTiOPO_4$ produced when the proportion of $KTiOPO_4$ components in a melt is reduced.

Natural faces which emerged on the resultant single crystal of $KTiOPO_4$ were (100), (011), (201), and (110), as shown FIG. 4.

By using the single crystal of $KTiOPO_4$ thus produced, observation of domain was carried out in the following manner.

Namely, the single crystal of $KTiOPO_4$ was cut out into a (001) plate (C plate), and its surface was processed by mirror plane abrasion. The C plate was etched in a solution of mixture hydrofluoric acid (HF) and nitric acid ($HNO_3$) at a proportion of 1:4, at the room temperature for 20 minutes. Then, the surface processed by mirror plane abrasion was observed. If the resultant single crystal of $KTiOPO_4$ has multi-domain, steps are generated on the surface of the C plate, depending on differences of etching rate due to the direction of polarization. Thus, making use of this phenomenon, polarization of the crystal can be easily examined by observing the surface of the C plate with an optical microscope.

As a result, multi-domain was rarely seen in the single crystal of $KTiOPO_4$, and domain was observed only in a portion where a cavity was generated.

EXAMPLES 2 TO 5

Next, a single crystal of $KTiOPO_4$ was produced by using $K_{15}P_{13}O_{40}$ (mol ratio of $P_2O_5$, 46.43%; $K_2O$, 53.57%) as in example 1 and with a melt composition having larger proportion of the $KTiOPO_4$ component than in example 1.

That is, each reagent was weighed so as to produce a melt composition shown in Table 1, and presintered mixture was carried out in the same manner as in example 1. Compositions in examples 2 to 5 are indicated by $J_2$ to $J_5$, respectively in FIG. 3

TABLE 1

| | Flux Composition (mol %) | | Melt Composition (mol %) | | Components of Melt (mol fraction) | | | Mass of Reagent (g) | | |
|---|---|---|---|---|---|---|---|---|---|---|
| Ex | $P_2O_5$ | $K_2O$ | $KTiOPO_4$ | $K_{15}P_{13}O_{40}$ | $K_2O$ | $P_2O_5$ | $TiO_2$ | $KH_2PO_4$ | $K_2HPO_4$ | $TiO_2$ |
| 1 | 46.43 | 53.57 | 83.66 | 16.34 | 0.4150 | 0.3737 | 0.2113 | 456.54 | 72.49 | 85.15 |
| 2 | 46.43 | 53.57 | 84.62 | 15.38 | 0.4100 | 0.3700 | 0.2200 | 454.38 | 70.49 | 88.93 |
| 3 | 46.43 | 53.57 | 86.36 | 13.64 | 0.4000 | 0.3625 | 0.2376 | 531.05 | 78.43 | 113.92 |
| 4 | 46.43 | 53.57 | 88.66 | 11.34 | 0.3850 | 0.3512 | 0.2638 | 443.37 | 60.32 | 108.12 |
| 5 | 46.43 | 53.57 | 90.00 | 10.00 | 0.3750 | 0.3438 | 0.2813 | 438.88 | 56.17 | 115.92 |
| 6 | 46.43 | 53.57 | 84.62 | 15.38 | 0.4100 | 0.3700 | 0.2200 | 454.38 | 70.49 | 88.93 |
| 7 | 48.00 | 52.00 | — | — | 0.4150 | 0.3906 | 0.1944 | 497.93 | 42.55 | 77.63 |
| 8 | 48.00 | 52.00 | — | — | 0.3850 | 0.3650 | 0.2500 | 477.97 | 35.46 | 101.68 |
| 9 | 43.00 | 57.00 | — | — | 0.4000 | 0.3344 | 0.2656 | 378.23 | 118.21 | 109.74 |
| 10 | 43.00 | 57.00 | — | — | 0.3850 | 0.3260 | 0.2890 | 378.22 | 107.13 | 120.26 |

The saturation temperatures Ts of the resultant mixture were measured. The results are shown in Table 2.

TABLE 2

| Ex. | Saturation Temperature (°C.) | $KTiOPO_4$ Crystal Weight (g) | Cooling Temperature Range (°C.) |
|---|---|---|---|
| 1 | 994 | 8.2 | 990~951 |
| 2 | 1000 | 5.4 | 995~957 |
| 3 | 1017 | 12.2 | 1014~975 |
| 4 | 1049 | 29.1 | 1044~1005 |
| 5 | 1069 | 25.2 | 1063~1029 |
| 6 | 1000 | 22.9 | 994~927 |
| 7 | 963 | 3.3 | 958~920 |
| 8 | 1029 | 10.2 | 1024~985 |
| 9 | 1050 | 35.1 | 1046~1008 |
| 10 | 1078 | 49.7 | 1073~1035 |

Then, growth of the $KTiOPO_4$ crystal was carried out under the same growth conditions except for changes in the cooling temperature as shown in Table 2.

After the growth, the cooling was carried out under the same conditions as in example 1, thereby producing the single crystal of $KTiOPO_4$. The weight of the resultant single crystal of $KTiOPO_4$ was 5.4 g in example 2, 12.2 g in example 3, 29.1 g in example 4, and 25.2 g in example 5.

Natural faces which emerged on the resultant single crystal of $KTiOPO_4$ were (100), (011), (201), and (110), indicating the same results as in example 1.

The single crystal of $KTiOPO_4$ thus produced was cut out by the (001) plate, and observation of domain in the etching method was carried out. Multi-domain was rarely seen, and domain was observed only in a portion where a cavity was generated.

Next, the cooling temperature range was examined.

EXAMPLE 6

A single crystal of $KTiOPO_4$ was produced in the same manner as in example 2, with the same melt composition as in example 2, but with the cooling temperature range of 994°-927° C. which is broader than in example 2. The weight of the resultant single crystal of $KTiOPO_4$ was 22.9 g.

Natural faces which emerged on the resultant single crystal of $KTiOPO_4$ were (100), (010), (201), and (110), indicating the same result as in example 1.

The single crystal of $KTiOPO_4$ thus produced was cut out by the (001) plate, and observation of domain in the etching method was carried out. Multi-domain was rarely seen, and domain was observed only in a portion where a cavity was generated.

The single domain was found to be maintained despite the change in the cooling temperature range.

EXAMPLE 7

Next, a single crystal of $KTiOPO_4$ was produced by using a flux having a $P_2O_5$ molar ratio ($P_2O_5/(P_2O_5+K_2O)$) of 48.00 mol %.

That is, each reagent was weighed so that components of a melt was as shown in Table 1, and presintered mixture was carries out in the same manner as in example 1. The composition in the present example is indicated by $J_7$ in FIG. 3.

The saturation temperature Ts of the resultant mixture was measured. The result is shown in Table 2.

Then, crystal growth of the single crystal of $KTiOPO_4$ was carried out under the same growth conditions as in example 1 except for a change in the cooling temperature range as shown in Table 2. After the growth, cooling was carried out under the same conditions as in example 1, thereby producing the single crystal of $KTiOPO_4$. The weight of the resultant single crystal of $KTiOPO_4$ was 3.3 g.

However, when the solidified melt after the growth was washed with hot water, about 19 g of colorless transparent crystal of dice shape several mm in each side existed. By an X-ray powder diffraction method, the dice-shaped crystal was found to be a composition of $KTi_2(PO_4)_3$. Meanwhile, in examples 1 to 4, such a dice-shaped crystal was not precipitated. It was earned that with the present melt composition, two phases of a $KTiOPO_4$ composition and a $KTi_2(PO_4)_3$ composition were precipitated.

Natural faces which emerged on the resultant single crystal of $KTiOPO_4$ were (100), (011), (201), and (110), indicating the same result as in example 1.

The single crystal of $KTiOPO_4$ thus produced was cut out by the (001) plate, and observation of domain in the etching method was carried out. The result is that multi-domain was rarely seen, and that domain observed only portion where a cavity was generated.

EXAMPLE 8

Next, a single crystal of $KTiOPO_4$ was produced by using a flux having a $P_2O_5$ molar ratio ($P_2O_5/(P_2O_5+K_2O)$) of 48.00 mol % as in example 7 and by using larger proportion of the $KTiOPO_4$ component than in example 7.

That is, each reagent was weighed so that components in a melt were as shown in Table 1, and presintered mixture was carried out in the same manner as in example 1. The composition in the present example is indicated by $J_8$ in FIG. 3.

Later, the saturation temperature Ts was measured. The result is shown in Table 2.

Then, crystal growth of the single crystal of KTiOPO$_4$ was carried out under the same growth conditions as in example 1 except for a change in the cooling temperature range as shown in Table 2. After the growth, cooling was carried out under the same conditions as in example 1, thereby producing the single crystal of KTiOPO$_4$. The weight of the resultant single crystal of KTiOPO$_4$ was 10.2 g.

In the present example, a dice-shaped crystal of KTi$_2$(PO$_4$)$_3$ as in example 7 did not exist in the solidified melt.

Natural faces which emerged on the resultant single crystal of KTiOPO$_4$ were (100), (011), (201), and (110), indicating the same results as in example 1.

The single crystal of KTiOPO$_4$ thus produced was cut out by the (001) plate, and observation of domain in the etching method was carried out. The result is that multi-domain was rarely seen, and that domain was observed only in a portion where a cavity was generated.

The single domain was found to be maintained despite the change in the cooling temperature range.

EXAMPLES 9 AND 10

Next, a single crystal of KTiOPO$_4$ was produced by using a flux having a P$_2$O$_5$ molar ratio (P$_2$O$_5$+K$_2$O)) of 43.00 mol %.

That is, each reagent was weighed so that components in a melt were as shown in Table 1, and presintered mixture was carried out in the same manner as in example 1. Compositions in examples 9 and 10 are indicated by J$_9$ and J$_{10}$, respectively, in FIG. 3.

Later, the saturation temperatures Ts of the resultant mixture were measured. The results are shown in Table 2.

Then, crystal growth of the single crystal of KTiOPO$_4$ was carried out under the same growth conditions as in example 1 except for changes in the cooling temperature range shown in Table 2. After the growth, cooling was carried out under the same conditions as in example 1, thereby producing the single crystal of KTiOPO$_4$. The weight of the resultant single crystal of KTiOPO$_4$ was 35.1 g in example 9 and 49.7 g in example 10.

Natural faces which emerged on the resultant single crystal of KTiOPO$_4$ were (100) (011) (201) and (110) indicating the same results as in example 1.

The single crystal of KTiOPO$_4$ thus produced was cut out by the (001) plate, arid observation of domain in the etching method was carried out. The result is that multi-domain was rarely seen, and that domain was observed only portion where a cavity was generated.

COMPARATIVE EXAMPLES 1 TO 4

At this stage, cases in which a single crystal of KTiOPO$_4$ was produced by using K$_{15}$P$_{13}$O$_{40}$ as a flux as in examples 1 to 6 but with a melt composition having less KTiOPO$_4$ component than in examples 1 to 6 were examined.

That is, each reagent was weighed so as to obtain melt compositions as shown in Table 3, and presintered mixture was carried out in the same manner as in example 1. Then, the saturation temperatures Ts of the resultant mixture were measured. The results are shown in Table 4.

TABLE 3

| C. Ex | Flux Composition (mol %) | | Melt Composition (mol %) | | Components of Melt (mol fraction) | | | Mass of Reagent (g) | | |
|---|---|---|---|---|---|---|---|---|---|---|
| | P$_2$O$_5$ | K$_2$O | KTiOPO$_4$ | K$_{15}$P$_{13}$O$_{40}$ | K$_2$O | P$_2$O$_5$ | TiO$_2$ | KH$_2$PO$_4$ | K$_2$HPO$_4$ | TiO$_2$ |
| 1 | 46.43 | 53.57 | 83.17 | 16.83 | 0.4175 | 0.3756 | 0.2069 | 457.62 | 73.49 | 83.27 |
| 2 | 46.43 | 53.57 | 82.65 | 17.35 | 0.4200 | 0.3775 | 0.2025 | 458.70 | 74.48 | 81.40 |
| 3 | 46.43 | 53.57 | 81.58 | 18.42 | 0.4250 | 0.3813 | 0.1938 | 460.84 | 76.46 | 77.66 |
| 4 | 46.43 | 53.57 | 80.43 | 19.57 | 0.4300 | 0.3850 | 0.1850 | 462.97 | 78.43 | 73.95 |
| 5 | 46.43 | 53.57 | 82.65 | 17.35 | 0.4200 | 0.3775 | 0.2025 | 458.70 | 74.48 | 81.40 |
| 6 | 46.43 | 53.57 | 81.58 | 18.42 | 0.4250 | 0.3813 | 0.1938 | 460.84 | 76.49 | 77.66 |
| 7 | 50.00 | 50.00 | — | — | 0.3900 | 0.3900 | 0.2200 | 532.32 | — | 88.15 |
| 8 | 49.00 | 51.00 | — | — | 0.3850 | 0.3746 | 0.2404 | 501.84 | 18.31 | 97.23 |
| 9 | 43.00 | 57.00 | — | — | 0.4150 | 0.3430 | 0.2420 | 378.25 | 129.14 | 99.37 |
| 10 | 40.00 | 60.00 | — | — | 0.4390 | 0.3310 | 0.2300 | 331.64 | 205.80 | 100.31 |
| 11 | 40.00 | 60.00 | — | — | 0.4150 | 0.3207 | 0.2643 | 320.58 | 170.85 | 109.84 |
| 12 | 33.33 | 66.67 | — | — | 0.4300 | 0.2860 | 0.2840 | 204.80 | 265.82 | 120.24 |

TABLE 4

| C. Ex. | Saturation Temperature (°C.) | KTiOPO$_4$ Crystal Weight (g) | Cooling Temperature Range (°C.) |
|---|---|---|---|
| 1 | 986 | 6.2 | 983~943 |
| 2 | 982 | 6.8 | 978~941 |
| 3 | 970 | 6.4 | 966~927 |
| 4 | 959 | 5.9 | 954~915 |
| 5 | 982 | 21.0 | 978~928 |
| 6 | 970 | 3.1 | 965~940 |
| 7 | 1004 | — | — |
| 8 | 1020 | — | 1011~974 |
| 9 | 1033 | 15.8 | 1028~989 |
| 10 | 1007 | 32.0 | 1002~962 |
| 11 | 1046 | 26.4 | 1041~1014 |
| 12 | 1010 | 38.5 | 1005~967 |

Figure 3:
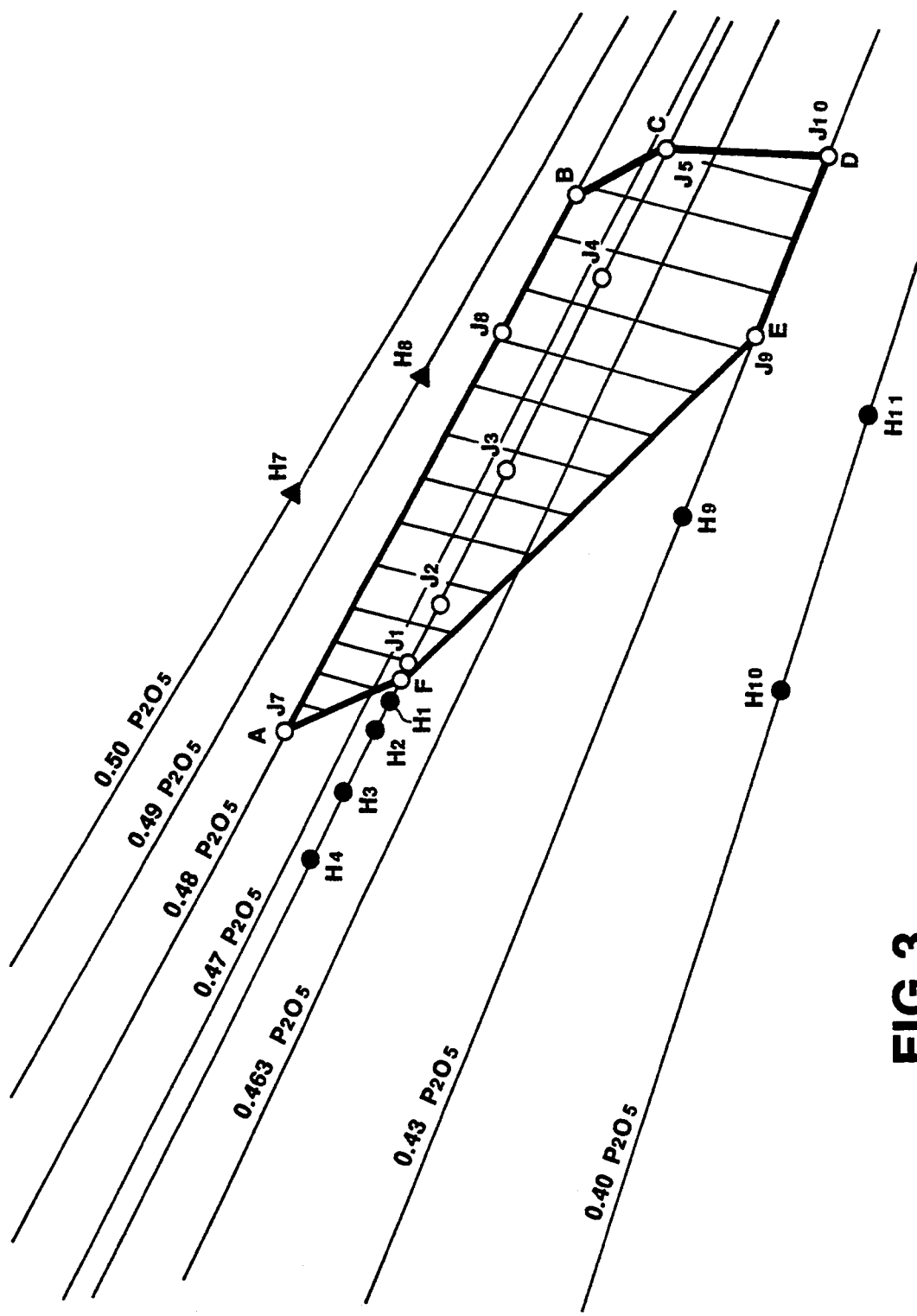
FIG. 3 is an enlarged view of the ternary phase diagram of $K_2O$-$P_2O_5$-$TiO_2$.

Meanwhile, compositions in comparative examples 1 to 4 are indicated by H$_1$ to H$_4$, respectively, in FIG. 3.

Then, crystal growth of the single crystal of KTiOPO$_4$ was carried out under the same growth conditions as in example 1 except for changes in the cooling temperature range as shown in Table 4.

After the growth, cooling was carried out under the same conditions as in example 1, thereby producing the single crystal of KTiOPO$_4$. The weight of the resultant single crystal of KTiOPO$_4$ was 6.2 g in comparative example 1, 6.8 g in comparative example 2, 6.4 g comparative example 3, and 5.9 g in comparative example 4.

Natural faces which emerged on the resultant single crystal of KTiOPO$_4$ were (100), (011), (201), and (110).

The single crystal of KTiOPO$_4$ thus produced was cut out by the (001) plate, and observation of domain in the etching method was carried out. The result is that, in comparative examples 1 and 2, multi-domain was observed at the upper portion close to the seed of the crystal without having single domain over the entire crystal. In comparative example 3, multi-domain was observed over substantially the entire crystal. In comparative example 4, frame-shaped multi-domain (area indicated by slant lines in FIG. 4) was observed over substantially the entire region of the resultant single crystal 8 of $KTiOPO_4$.

Next, the cooling temperature range was examined.

COMPARATIVE EXAMPLES 5 AND 6

A single crystal of $KTiOPO_4$ was produced in the same manner as in comparative examples 2 and 3, with the same melt composition as in comparative examples 2 and 3 as shown in Table 3, but with different cooling temperature ranges of 978°~928° C. (a range broader than comparative example 2) and 965°~940° C. (a range narrower than in comparative example 3) as shown in Table 4.

As a result, 21.0 g and 3.1 g of single crystal of $KTiOPO_4$ were produced in comparative examples 5 and 6, respectively. Natural faces which emerged on these single crystals of $KTiOpO_4$ were (100), (011), (201), and (110), as seen in comparative examples 2 and 3.

Then, observation of domain of the single crystal of $KTiOPO_4$ was carried out in the above-mentioned manner. In comparative example 5, multi-domain was observed across the upper portion close to the seed off the crystal and an intermediate portion, and single domain over the entire region was not seen. In comparative example 6, multi-domain was observed over substantially the entire region of the crystal.

The results of examples 1 to 5 and comparative examples 1 to 4 are shown in FIG. 3. In FIG. 3, O indicates the composition by which the single crystal of $KTiOPO_4$ of single domain was produced, and ● indicates the composition by which the resultant single crystal of $KTiOPO_4$ was made into multi-domain. As seen from the results of FIG. 3, the single crystal of $KTiOPO_4$ of single domain was produced in examples 1 to 5, but not produced in comparative examples 1 to 4. Accordingly, it was found that in growth the single crystal of $KFiOPO_4$ using the flux of $K_{15}P_{13}O_{40}$, production of single domain in an as-grown crystal depends on melt composition, and that production of single domain is achieved by employing the melt composition in which the proportion of the $KTiOPO_4$ component is 83.5% or higher. Also, the upper limit of the proportion of the $KTiOPO_4$ in the melt composition may be set to 90.0%, in consideration of coloring to the crystal due to a rise in the saturation temperature or vaporization of the flux due to high temperature growth.

Further, from combination of the results of example 6, comparative examples 5 and 6, it can be found that in growth of the single crystal of $KTiOPO_4$ using the flux of $K_{15}P_{13}O_{40}$, the cooling temperature; does not affect production of single domain in the single crystal of $KTiOPO_4$.

When, in examples 1 to 6, SHG characteristics of the single crystal of $KTiOPO_4$ in which production of single domain was achieved were examined, it was confirmed that there was only one peak of light intensity, indicating complete achievement of single domain.

Figure 6:
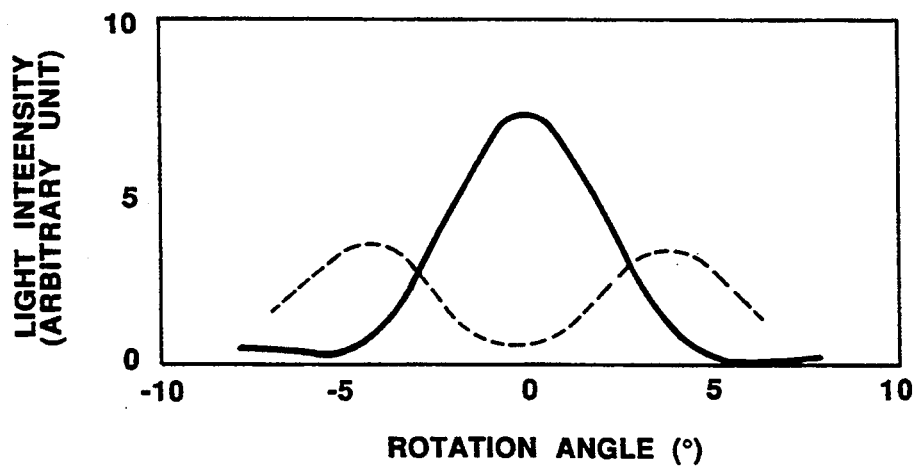
FIG. 6 is a graph showing SHG characteristics of the single crystal of $KTiOPO_4$ of the present invention.

For instance, SHG characteristics of the single crystal of $KTiOPO_4$ produced in example 1 and the single crystal of $KTiOPO_4$ produced in comparative example 4 are shown in FIG. 6. In measuring SHG characteristics, SHG output (of the order of μW) was measured by a photomultiplier under the following conditions: thickness of species, about 2.5 mm; YAG input, 100 mW; YAG input wavelength, 1064 nm; and SHG output wavelength, 532 nm.

Referring to FIG. 6, in example 1 only one peak of light intensity existed as shown by a solid line, while in comparative example 4 two peaks of light intensity existed as shown by a broken line, indicating the presence of multi-domain. Phase matching angles of type 2 under these conditions are as follows. That is, when the flux $K_{15}P_{13}O_{40}$ was used, $\theta$ was 90° and $\phi$ was about 21°, indicating a shift to the low angle side by about 2°, compared with the case of $\theta=90°$, $\phi=23.2°$ in which the flux $K_6P_4O_{13}$ was used.

Further, polarization of resultant crystals with different compositions of the flux was examined.

COMPARATIVE EXAMPLE 7

A single crystal of $KTiOPO_4$ was produced by using a flux having a $P_2O_5$ molar ratio ($P_2O_5/(P_2O_5+K_2O)$) of 50.00 mol %.

That is, each reagent was weighed so that components of a melt were as shown in Table 3, and presintered mixture was carried out in the same manner as in example 1. The composition in the present comparative example is indicated by $H_7$ in FIG. 3.

Later, when the saturation temperature Ts of the resultant mixture was measured, a substance precipitated on the seed crystal of $KTiOPO_4$ at 1004° C. was not a $KTiOPO_4$ crystal but a dice-shaped crystal of $KTi_2(PO_4)_3$. It was found that with this melt composition, the crystal of $KTi_2(PO_4)_3$ was precipitated as an initial crystal.

Thus, instead of carrying out crystal growth by the TSSG method, the melt was cooled to 800° C., at which the melt was maintained for 22 hours. Then, the melt was quickly cooled, and the solid phase in equilibrium with 800° C. was examined.

The solidified melt was washed with hot water, and a precipitated substance was measured by the X-ray powder diffraction method. The result is that the majority of the composition was of $KTi_2(PO_4)_3$, and that only little $KTiOPO_4$ composition was detected.

COMPARATIVE EXAMPLE 8

A single crystal of $KTiOPO_4$ was produced by using a flux having a $P_2O_5$ molar ratio ($P_2O_5/(P_2O_5+K_2O)$) of 49.00 mol %.

That is, each reagent was weighed so that components of a melt were as shown in Table 3, and presintered mixture was carried out in the same manner as in example 1. The composition in the present comparative example is indicated by $H_8$ in FIG. 3.

Later, the saturation temperature Ts of the resultant mixture was measured. Although the crystal of $KTiOPO_4$ was melted by a small amount at 1025° C., a dice-shaped minute crystal of $KTi_2(PO_4)_3$ was precipitated on the surface of the $KTiOPO_4$ crystal. Further, when observation was carried out by reducing the temperature to 1014° C., it was found the crystal of $KTiOPO_4$ had been grown on the seed crystal of $KTiOPO_4$. At this time, precipitation of the crystal of $KTi_2(PO_4)_3$ was not seen. Despite quite an unstable melt construction, growth was carried out by the TSSG method. The growth was carried out under the same growth conditions as in example 1 except for a change in the cooling temperature range as shown in Table 4.

The weight of the resultant crystal was 17.1 g. The crystal exhibited a cubic shape, and was obviously different from the $KTiOPO_4$ crystal. When the resultant crystal was measured by the X-ray powder diffraction method, it was confirmed that the crystal was a $KTi_2(PO_4)_3$ crystal.

COMPARATIVE EXAMPLE 9

A single crystal of $KTiOPO_4$ was produced by using a flux having a $P_2O_5$ molar ratio ($P_2O_5/(P_2O_5+K_2O)$) of 43.00 mol % as in examples 9 and 10, and with melt composition having less $KTiOPO_4$ component than in examples 9 and 10.

That is, each reagent was weighed so that components of a melt were as shown in Table 3, and presintered mixture was carried out in the same manner as in example 1. Then, the saturation temperature Ts of the resultant mixture was measured. The result is shown in Table 4. The composition in the present comparative example, is indicated by $H_g$ in FIG. 3.

Then, growth of the $KTiOPO_4$ crystal was carried out under the same growth conditions as in example 1 except for a change in the cooling temperature range as shown in Table 4. After the growth, cooling was carried out under the same conditions as in example 1, thereby producing the single crystal of $KTiOPO_4$. The weight of the resultant single crystal of $KTiOPO_4$ was 15.8 g.

Natural faces which emerged on the single crystal of $KTiOPO_4$ were (100), (011), (201), and (110), indicating the same result as in example 1.

The single crystal of $KTiOPO_4$ was cut out by the (001) plate, and observation of domain in the etching method was carried out. The result is that domain having a stripe width of about 50 μm to 0.5 mm parallel to <010> was generated. Accordingly, it was found that if the proportion of the $KTiOPO_4$ component in the melt composition is reduced, a crystal of single domain cannot be produced despite the use of the same flux as in examples 9 and 10.

COMPARATIVE EXAMPLES 10 TO 12

A single crystal of $KTiOPO_4$ was produced by using $K_6P_4O_{13}$ having a $P_2O_5$ molar ratio ($P_2O_5/(P_2O_5+K_2O)$) of 40.00 mol % and $K_4P_2O_7$ having a $P_2O_5$ molar ratio of 33.33 mol % as a flux.

That is, each reagent was weighed so that components of a melt were as shown in Table 3, and presintered mixture was carried out in the same manner as in example 1. Then, the saturation temperatures Ts were measured. The results are shown in Table 4. Compositions in comparative examples 10 and 11 are indicated by $H_{10}$ and $H_{11}$, respectively, in FIG. 3.

Then, growth of the $KTiOPO_4$ crystal was carried out under the same growth conditions as in example 1 except for changes in the cooling temperature range as shown in Table 4. After the growth, cooling was carried out under the same conditions as in example 1, thereby producing the single crystal of $KTiOPO_4$. The weight of the resultant single crystal of $KTiOPO_4$ was 32.0 g in comparative example 10, 26.4 g in comparative example 11, and 38.5 g in comparative example 12.

Natural faces which emerged on the resultant single crystal of $KTiOPO_4$ were (100), (011), (201), and (110), indicating the same results as in example 1.

Later, observation of domain of the single crystal of $KTiOPO_4$ was carried out in the above-mentioned manner. In comparative examples 10 and 11, domain having a stripe width of about 50 μm to 0.5 mm parallel to <010> was generated substantially. On the other hand, in comparative example 12, domain having a stripe width of about 50 μm parallel to <100> and <010> was generated. Accordingly, it was found that if the fluxes $K_6P_4O_{13}$ and $K_4P_2O_7$ are used, a crystal of single domain in good conditions cannot be produced.

The results of comparative examples 7 to 11 are shown in FIG. 3. As described above, ● in FIG. 3 indicates the composition by which the resultant single crystal of $KTiOPO_4$ was of multi-domain, and ▲ in FIG. 3 indicates the composition by which the crystal of $KTi_2(PO_4)_3$ instead of the single crystal of $KTiOPO_4$ was produced, As is clear from the results in FIG. 3, in comparative examples 7 and 8, in which the proportion of $P_2O_5$ in the flux was relatively large, the crystal of $KTi_2(PO_4)_3$ was produced. On the other hand, in comparative examples 9 to 11, in which the proportion of $P_2O_5$ in the flux was small, the single crystal of $KTiOPO_4$ of multi-domain was produced.

Accordingly, from the results of comparative examples 1 to 2, it was confirmed that the melt composition by which it is possible to carry out growth of the single crystal of $KTiOPO_4$ and production of single domain in the as-grown crystal is such that molar fractions of $K_2O$, $P_2O_5$ and $TiO_2$ contained in the melt are within the region surrounded by six points in the $K_2O$-$P_2O_5$-$TiO_2$ ternary phase diagram, that is, A ($K_2O$: 0.4150, $P_2O_5$: 0.3906, $TiO_2$: 0.1944), B ($K_2O$: 0.3750, $P_2O_5$: 0.3665, $TiO_2$: 0.2685), C ($K_2O$: 0.3750, $P_2O_5$: 0.3438, $tiO_2$: 0.2813), D ($K_2O$: 0.3850, $P_2O_5$: 0.3260, $TiO_2$: 0.2890), E ($K_2O$: 0.4000, $P_2O_5$: 0.3344, $TiO_2$: 0.2656), and F ($K_2O$: 0.4158, $P_2O_5$ 0.3744, $tiO_2$: 0.2098).

What we claim is:

1. A method of producing a single crystal of $KTiOPO_4$ for growing a single crystal of $KTiOPO_4$ by melting a $KTiOPO_4$ material together with a flux into a melt, contacting a seed crystal to the melt, and slowly cooling at a saturation temperature or lower, said method comprising setting molar fractions of $K_2O$, $P_2O_5$ and $TiO_2$ contained in the melt within a region surrounded by six points in a $K_2O$-$P_2O_5$-$TiO_2$ ternary phase diagram of A ($K_2O$: 0.4150, $P_2O_5$: 0.3906, $TiO_2$: 0.1944), B ($K_2O$: 0.3750, $P_2O_5$: 0.3565, $TiO_2$: 0.2685), C ($K_2O$: 0.3750, $P_2O_5$: 0.3438, $TiO_2$: 0.2813), D ($K_2O$: 0.3850, $P_2O_5$: 0.3260, $TiO_2$: 0.2890), E ($K_2O$: 0.4000, $P_2O_5$: 0.3344, $TiO_2$: 0.2656), and F ($K_2O$: 0.4158, $P_2O_5$: 0.3744, $TiO_2$: 0.2098).

2. The method of producing a single crystal of $KTiOPO_4$ as claimed in claim 1 wherein $K_{15}P_{13}O_{40}$ or a same composition produced by melting is used as the flux while a proportion of a $KTiOPO_4$ component in a composition of the melt is set to 83.5 to 90.0 mol %.

3. The method of producing a single crystal of $KTiOPO_4$ as claimed in claim 1 wherein the seed crystal is a crystal of $KTiOPO_4$ and wherein a C axis is arranged to be perpendicular to a melt surface at least at a portion where the seed crystal contacts the melt.

4. The method of producing a single crystal of $KTiOPO_4$ as claimed in claim 3 wherein the seed crystal is a columnar single crystal long in a direction of the C axis.

5. The method of producing a single crystal of $KTiOPO_4$ as claimed in claim 3 wherein the seed crystal is cooled while being rotated.

6. The method of producing a single crystal of $KTiOPO_4$ as claimed in claim 5 wherein a rotary speed at the time of cooling the seed crystal is set to 30 to 300 rpm.

7. The method of producing a single crystal of KTiOPO$_4$ as claimed in claim 5 wherein rotation at the time of cooling the seed crystal is a reverse turn.

8. The method of producing a single crystal of KTiOPO$_4$ as claimed in claim 1 wherein a cooling rate at the time of cooling the seed crystal is 0.01 to 5° C. per hour.

* * * * *